United States Patent [19]
Schaffer

[11] Patent Number: 5,142,242
[45] Date of Patent: Aug. 25, 1992

[54] PRECISION TRANSCONDUCTANCE AMPLIFIER

[75] Inventor: Gregory L. Schaffer, Cupertino, Calif.

[73] Assignee: Maxim Integrated Products, Sunnyvale, Calif.

[21] Appl. No.: 741,764

[22] Filed: Aug. 7, 1991

[51] Int. Cl.$^5$ ............................ H03F 3/45; H03F 3/16
[52] U.S. Cl. .................... 330/253; 330/257; 330/288
[58] Field of Search ............... 330/253, 257, 252, 288; 323/315, 316

[56] References Cited

U.S. PATENT DOCUMENTS

| | | | |
|---|---|---|---|
| 3,921,090 | 11/1975 | Wheatley et al. | 330/261 |
| 4,912,423 | 3/1990 | Milkovic et al. | 330/277 |
| 4,954,769 | 9/1990 | Kalthoff | 330/253 |
| 5,028,881 | 7/1991 | Spence | 330/253 |

Primary Examiner—Eugene R. LaRoche
Assistant Examiner—Tan Dinh
Attorney, Agent, or Firm—Blakely, Sokoloff, Taylor & Zafman

[57] ABSTRACT

A transconductance amplifier intended for high frequency, precision amplification. The amplifier has a unique architecture that sets gain by the ratio of two impedances. Unlike conventional amplifiers, the amplifier does not use external feedback. This makes the amplifier unusually stable since one needn't worry about phase shift due either to the amplifier or a feedback network. Consequently, the amplifier can be used in some rather unusual circuit applications, some of which would be impossible with conventional (feedback) amplifiers. Various embodiments are disclosed.

21 Claims, 9 Drawing Sheets

PRECISION TRANSCONDUCTANCE AMPLIFIER

BACKGROUND OF THE INVENTION

1. Field of the Invention

The present invention relates to the field of high frequency transconductance amplifiers.

2. Prior Art

There are at least three kinds of high frequency amplifiers: (1) conventional, (2) current feedback (transimpedance) and (3) transconductance amplifiers. Conventional amplifiers have high gain and good DC characteristics, but they have limited bandwidth (if they are unity-gain stable) and their gain-bandwidth product tends to be constant. Transimpedance amplifiers have lower gain, but higher bandwidth. Their DC performance is usually poor, and they usually have asymmetric inputs, but their bandwidth is fairly independent of gain. Transconductance amplifiers can have high bandwidth, but only if feedback is kept to a minimum. Their transconductance is usually set by a current, and the actual transconductance varies with process and temperature. To get any accuracy, one must use feedback, and this tends to slow the transconductance amplifiers down. However, since their transconductance can be programmed with a current, they can be made into variable gain amplifiers. However, their differential input voltage range is limited, and this usually confines them to current input designs (Norton amplifiers).

BRIEF SUMMARY OF THE INVENTION

A transconductance amplifier intended for high frequency, precision amplification. The amplifier has a unique architecture that sets gain by the ratio of two impedances. Unlike conventional amplifiers, the amplifier does not use external feedback. This makes the amplifier unusually stable since one needn't worry about phase shift due either to the amplifier or a feedback network. Consequently, the amplifier can be used in some rather unusual circuit applications, some of which would be impossible with conventional (feedback) amplifiers. Various embodiments are disclosed.

BRIEF DESCRIPTION OF THE DRAWINGS

FIGS. 2 through 8 illustrate various applications of the amplifier of the present invention wherein:

FIG. 2 shows the basic precision transconductance amplifier with single-ended output.

FIG. 5 illustrates a fully differential precision transconductance amplifier representative of the schematic that has been simulated.

FIG. 7 gives a possible pinout arrangement for the precision transconductance amplifier.

DETAILED DESCRIPTION OF THE INVENTION

Figure 1:
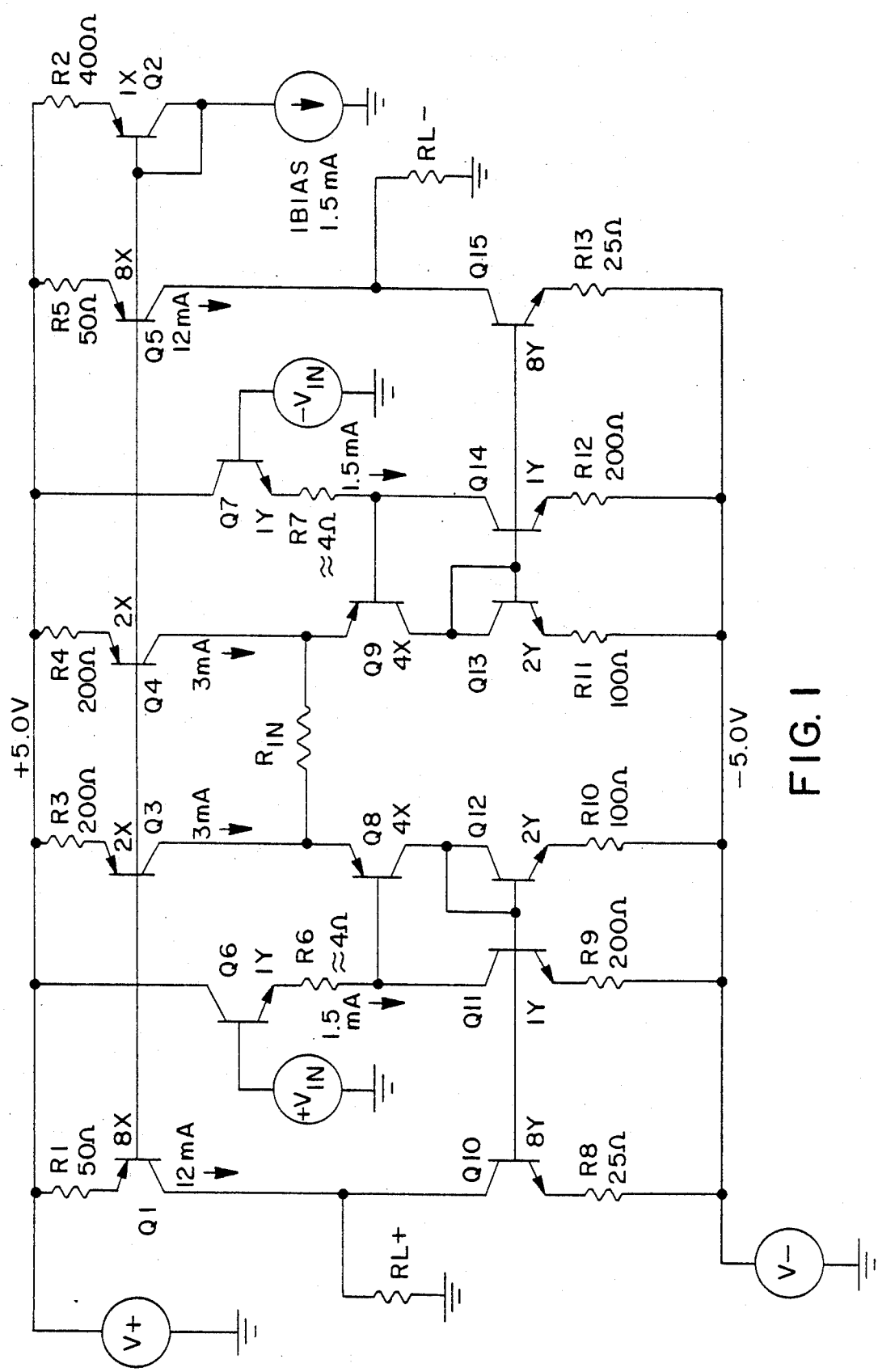
FIG. 1 is a circuit diagram for a preferred embodiment of the present invention in bipolar form.

First referring to FIG. 1, a preferred embodiment of the present invention in bipolar form may be seen. The amplifier shown is a precision differential transconductance amplifier having a differential input and a differential output. As shown in the figure, the circuit is biased by current source IBIAS through transistor Q2, which has its base connected to its collector. The base of transistor Q2 is also connected to the bases of transistors Q1, Q3, Q4 and Q5. The resistors R1, R3, R4, R5 and R2 are chosen in inverse proportion to the areas of transistors Q1, Q3, Q4, Q5 and Q2, respectively, so that each of the devices Q1, Q3, Q4, and Q5 act as current mirrors having a current therethrough proportional to the current through transistor Q2, IBIAS. The current through Q3 and Q4 was mirrored from IBIAS to be 3 milliamps and the current through Q1 and Q5 was mirrored from the current through Q2 to be 12 milliamps.

Coupled in series with the collector of transistor Q3 is the emitter of transistor Q8, the collector of transistor Q8 being coupled to the negative power supply terminal through a series combination of transistor Q12 coupled as a diode by the connection of its base to its collector and resistor RIO. Similarly, the collector of transistor Q4 is coupled to the emitter of transistor Q9, the collector of transistor Q9 being coupled to the negative power supply terminal through the diode-connected transistor Q13 and resistor R11. The collector of transistor Q8 is also connected to the base of transistors Q11 and Q10, which in turn have their emitters connected to the negative power supply terminal through resistors R9 and R8. Resistors R8, R9 and R10 are selected in inverse proportion to the areas of transistors Q10, Q11 and Q12 so that currents hproportional to the current through transistor Q12 are mirrored to transistors Q10 and Q11. In a preferred embodiment, the current through transistor Q11 is half that through transistor Q12, with the current through transistor Q10 being four times that through transistor Q12.

The circuit of FIG. 1 is fundamentally symmetrical. Accordingly, the collector of transistor Q9 is also connected to the base of Q14 and Q15, which together with resistors R12 and R13, each have a current therethrough proportional to the current through transistor Q13. Again, in the preferred embodiment being described, the current mirrored through transistor Q14 is one half that of the current through transistor Q13 and the current mirrored through transistor Q15 is four times that of the current through transistor Q13.

The base of transistor Q8 is connected to the collector of transistor Q11 and through resistor R6 to the emitter of transistor Q6. The collector of transistor Q6 is connected to the positive power supply terminal, with the base of transistor Q6 forming one of the differential inputs to the amplifier. With this connection it may be seen that the current through transistor Q8 is mirrored by transistor Q12 to transistors Q11 and Q6, the specific embodiment being described setting the current in transistors Q11 and Q6 to be one half that of the current in transistors Q8 and Q12, as stated before, in accordance with the ratio of areas of the respective transistors. Similarly, the base of transistor Q9 is connected to the collector of transistor Q14 and through resistor R7 to the emitter of transistor Q7, the collector of transistor Q7 being coupled to the positive power supply terminal and the base of transistor Q7 being the second differential input to the amplifier. Here again, the current through transistors Q9 and Q13 is mirrored proportionally to transistors Q14 and Q7, so that the current through transistor Q7 is always one half that of the current through transistor Q9 in the same way that the current through transistor Q6 is always one half that of the current through transistor Q8.

Finally, the positive output is taken from the connection of the collectors of transistors Q1 and Q10, and the negative output is taken from the connection of the collectors of transistors Q5 and Q15. In the case of the positive output, the output current is the difference between the current mirrored from IBIAS by Q2 to Q1 and the current mirrored from Q8 by Q12 to Q10. In the case of the negative output, the output current is the difference between the current mirrored from IBIAS by Q2 to Q5 and the current mirrored from Q9 by Q13 to Q15. When the input voltages (the voltages on the bases of transistors Q6 and Q7) are equal, the voltages of the emitters of Q8 and Q9 will be equal. Thus the current in RIN will be zero. In this condition, the current in Q3 and Q12 will be equal and thus the current in Q1 and Q10 will be equal, making the positive output current zero. Also the current in Q4 and Q13 will be equal and thus the current in Q5 and Q15 will be equal, making the negative output current zero also.

It may be seen from the foregoing that Q6 is an emitter follower, so that when VIN goes positive, Q6 pulls Q8's base positive. Q8's emitter follows its base. Thus some of Q3's collector current flows into RIN. This decreases Q8's emitter and collector currents. Q12 and R10 are part of a current mirror, wherein Q11 mirrors Q8's and Q12's current to Q6's emitter, and Q10 mirrors Q8's current to one of the outputs. Note that Q10 quadruples Q8's current while Q11 halves Q8's current. The result is that the change in output current is four times VIN/RIN. Normally, this wouldn't be a very accurate relationship because Q8's base-emitter voltage Vbe would change with emitter current Ie and cause an error. However, a unique aspect of the circuit is the feedback to Q6's emitter. By feeding back a signal proportional to Q8's emitter current, Q6's emitter current tracks Q8's, and that makes their base-emitter voltages the same. Consequently, the difference between the base voltage of Q6 and the emitter voltage of Q8 stays constant. In reality, the PNPs don't track the NPNs, as the PNPs behave like a theoretical transistor with some emitter series resistance. This can be cancelled out to a first approximation by adding a series resistor R6 to Q6. For this circuit, the impedance looking into Q8 is dropped from about 8 ohms to about 0.08 ohms. This improves linearity about a hundred times.

Simulations have been made for DC transfer response and AC frequency response for the circuit just described. For DC gain simulations, RIN = 40 ohms, and RL+ = RL− = 200 ohms. This gives a gain of about 10 V/V at each output, or a differential gain of 20 V/V. The simulation showed a gain of 19.846 V/v (instead of 20 V/V), for a 0.77% gain error. For smaller swings, say ±0.5V output, the gain is 19.952 V/V which gives only a 0.24% error.

The AC performance was also simulated under the same gain conditions (20 V/V gain). This gave a −3 dB frequency of around 80 MHz. The amplifier is fast because it has no internal phase compensation—it doesn't need any because one doesn't feed the output back to the—IN (vGND) terminal. The main frequency limitation is from Q8 and Q9 which run at a gain of around −5 V/V. Their gain-bandwidth product of about 600 MHz limits the bandwidth. By going to a cascode stage, gain-bandwidth could probably be improved.

A unity gain simulation was also done with RIN = 400 ohms and the same 200 ohm output load resistors. This gave a bandwidth of only about 200 MHz. It turned out that the reason for the roll-off was the output capacitance of Q1 and Q10 (and Q5 and Q15). The internal drive circuitry was rolling off around 350 MHz. In that regard, the amplifier behaves a little like the transimpedance amplifiers with bandwidth somewhat independent of gain. Going to lower output load resistors would improve bandwidth but limit the output voltage swing.

Figure 2:
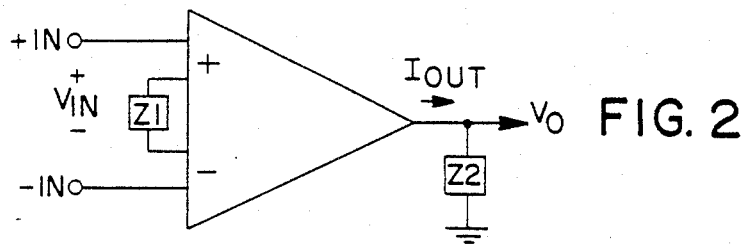

In FIGS. 2 through 8, various applications of the amplifier of the present invention may be seen. FIG. 2 shows the basic precision transconductance amplifier with single-ended output. This is easily achieved by mirroring one of the outputs over to the other output to get a push-pull output. Under such circumstances, $V_o V_{IN}$ is just K times Z2/Z1. There is a restriction: $|V_{IN}/Ai|$ must be kept less than Q3 (or Q4) collector current to keep the input stage from saturating. The controlling equations are as follows:

$$I_{OUT} = K \frac{+IN - (-IN)}{Z1} = K \frac{V_{IN}}{Z1}$$

$$V_o = I_{OUT} \times Z2 = K \frac{Z2}{Z1} V_{IN}$$

(K = 8 in the preferred embodiment)

$$\frac{V_o}{V_{IN}} = K \frac{Z2}{Z1}$$

RESTRICTIONS: $\left| \frac{V_{IN}}{Z1} \right| < 2 \, I_{SET} -$ about 3 mA $$|I_{OUT}| = M \times I_{SET}$$

M typically = 8 for differential, 16 for single ended output, $I_{OUT} = \pm 12$ ma max for differential, $\pm 24$ ma max for single ended output.

Figure 3A:
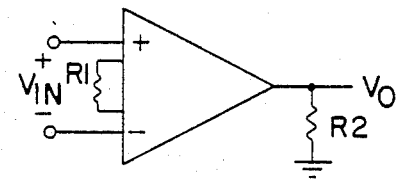
FIGS. 3a through 3d illustrate four applications of a single-ended output precision transconductance amplifier.
Figure 3B:
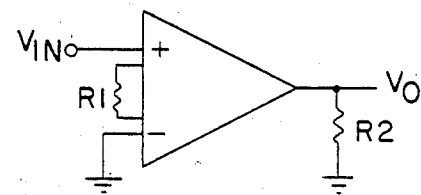

FIGS. 3a through 3d illustrate four applications of a single-ended output precision transconductance amplifier. The first three are quite straight-forward. Notice that in FIG. 3a the input is a differential signal. If one wants a ground based signal, ground one of the terminals to get a non-inverting (FIG. 3b) or inverting (FIG. 3c) amplifier. By using an L-C series circuit, one can make a high Q band pass amplifier. The amplifier achieves highest transconductance when the L-C circuit is at series resonance. Instead of an output load R, one could add a parallel L-C circuit for even higher gain. The controlling equations are as follows:

$$\frac{V_o}{V_{IN}} = K \frac{R2}{R1} \quad \text{For FIG. 3(a)}$$

$$\frac{V_o}{V_{IN}} = K \frac{R2}{R1} \quad \text{For FIG. 3(b)}$$

Figure 3C:
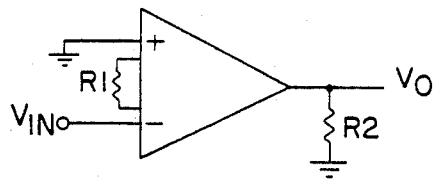

-continued $$\frac{V_o}{V_{IN}} = -K \frac{R2}{R1} \quad \text{For FIG. 3(c)}$$

Figure 3D:
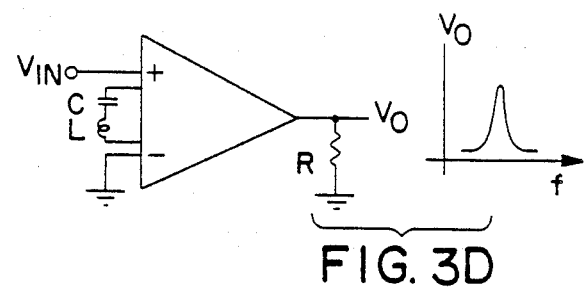

For FIG. 3(d), the gain is determined by R, L, C and G of the tuned circuit.

Figure 4A:
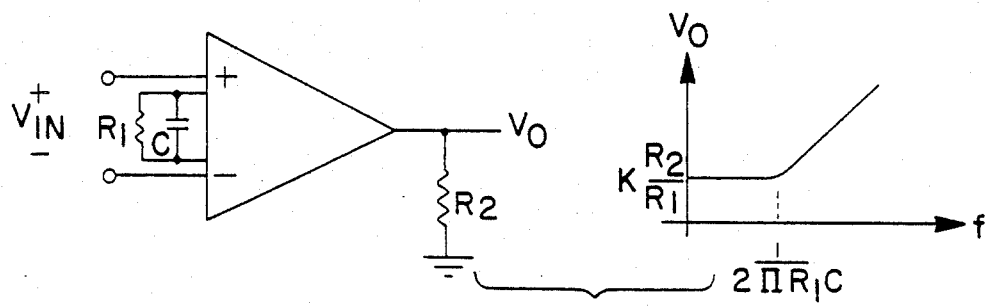
FIGS. 4a through 4d illustrate amplifiers with simple frequency shaping networks.
Figure 4B:
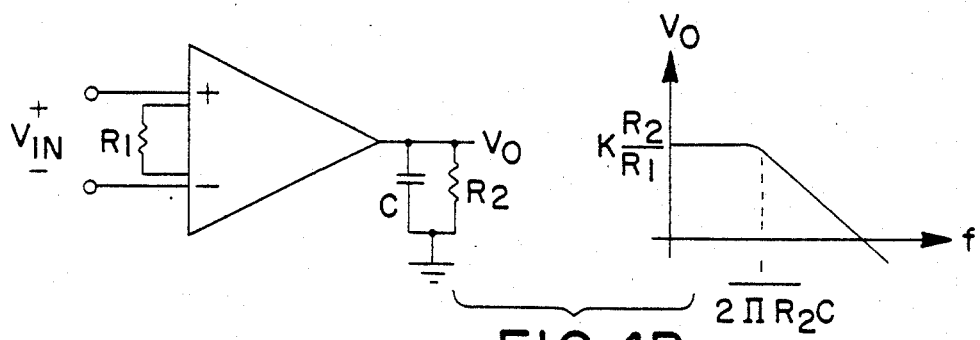
Figure 4C:
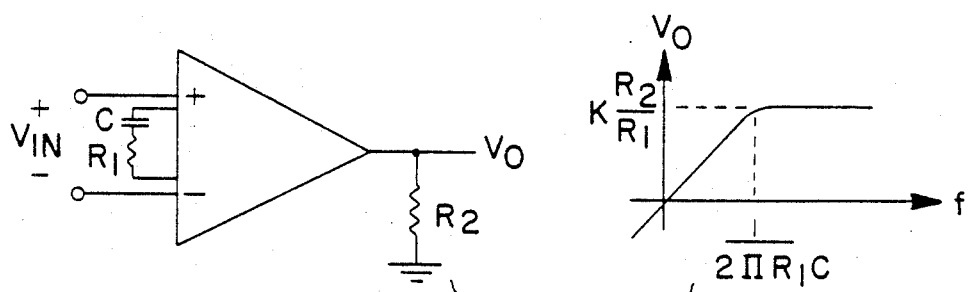
Figure 4D:
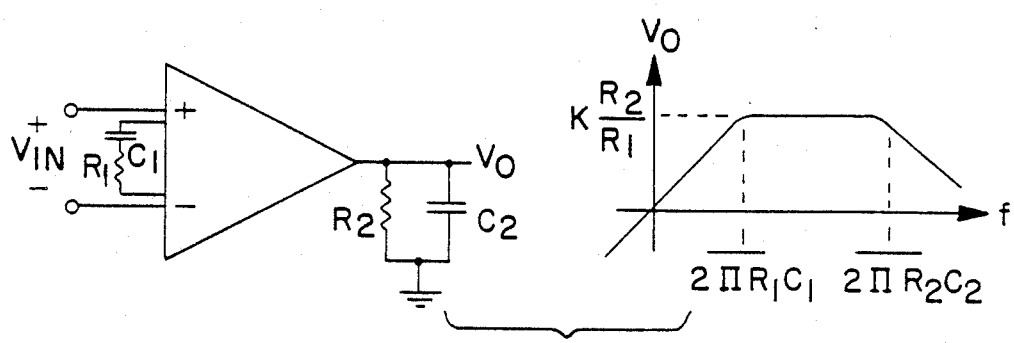

FIGS. 4a through 4d illustrate amplifiers with simple frequency shaping networks. Notice that the gain is K * Z2/Z1 in all the circuits. In FIG. 4d, both a zero and a pole combine to provide a broad bandpass amplifier. The zero and pole are independent since Zin and Zout do not interact with each other.

Figure 5:
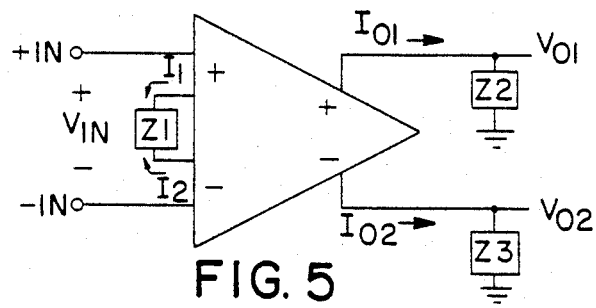

FIG. 5 illustrates a fully differential precision transconductance amplifier which is representative of the schematic that was simulated. The two outputs are independent, and one needn't use the same output loads. However, most applications will probably set Z2 = Z3. The controlling equations are as follows:

$$I_{01} = \frac{K}{2} I_1$$

(Typically $I_1 = -I_2$ and $I_1 = V_{IN}/Z_1$)

$$I_{02} = \frac{K}{2} I_2$$

$$V_{01} = \frac{K}{2} \frac{Z2}{Z1} V_{IN}$$

$$V_{02} = -\frac{K}{2} \frac{Z3}{Z1} V_{IN} = -V_{01} \text{ if } Z3 = Z2$$

Figure 6A:
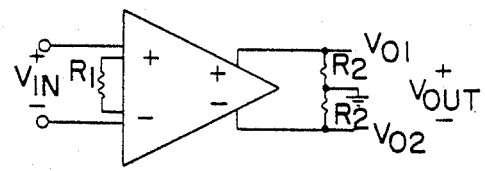
FIGS. 6a through 6c illustrate applications of the fully differential precision transconductance amplifier.
Figure 6B:
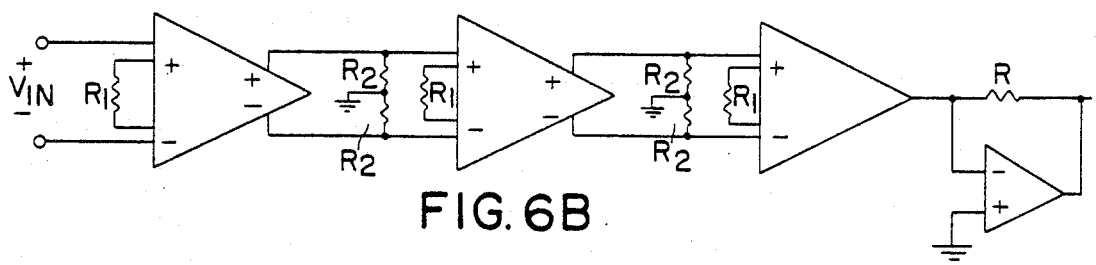
Figure 6C:
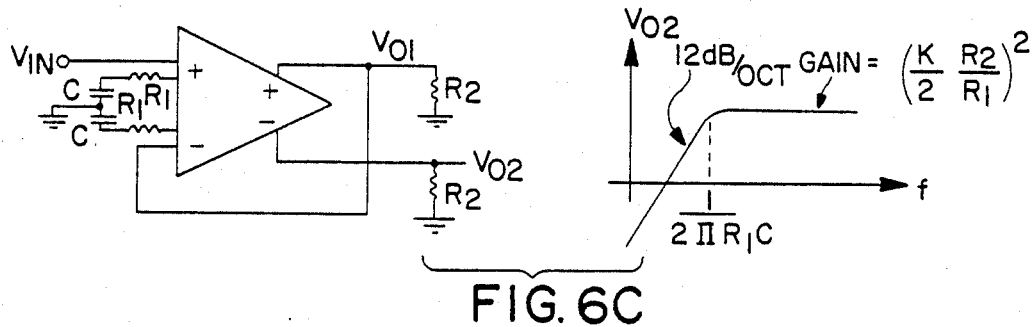

FIGS. 6a through 6c illustrate applications of the fully differential precision transconductance amplifier. The circuit in FIG. 6a is the simplest. It uses resistors to set a fixed gain. FIG. 6b shows three precision transconductance amplifiers cascaded together. The first two are differential. The third is single ended output and drives the input of a current mode amplifier. One can get a lot of gain out of this circuit. The circuit in FIG. 6c demonstrates the independence of the two sides of the fully differential amplifier. Here, a signal is sent into the +input, and its output drives the −input of the same amplifier. This gives substantially more gain than a single stage amplifier, but one must AC couple the controlling impedances to avoid DC offset errors. That is why the R1s are each in series with a DC blocking capacitor. The controlling equations are as follows:

$$V_{OUT} = V_{01} - V_{02} = \left( \frac{K}{2} \frac{R_2}{R_1} - \left( -\frac{K}{2} \frac{R_2}{R_1} \right) \right) \quad \text{FIG. 6a}$$

$$\frac{V_{OUT}}{V_{IN}} = K \frac{R_2}{R_1} \quad \text{FIG. 6a}$$

$$\frac{V_o}{V_{IN}} = -\left( \frac{K}{2} \frac{R_2}{R_1} \right)^2 \quad \text{FIG. 6b}$$

Figure 7:
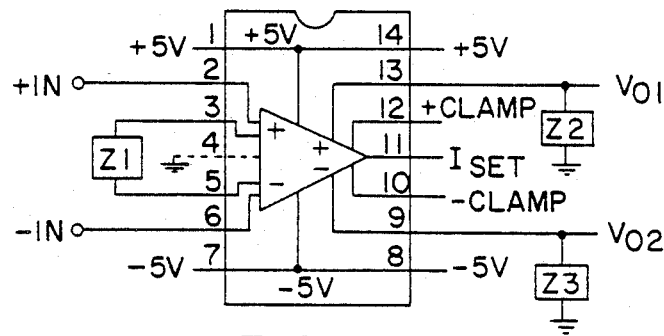

FIG. 7 gives a possible pinout arrangement for the precision transconductance amplifier. Note the symmetry. Power supply lines feed through, and output signals mate up with the input lines of the next amplifier. Positive and negative clamp lines can be used to limit output voltage swing.

Figure 8A:
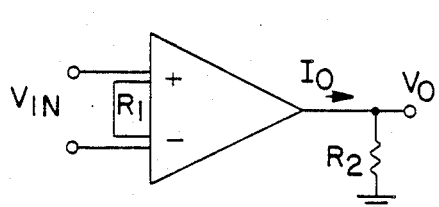
FIGS. 8a through 8d illustrate unusual applications of the precision transconductance amplifier.
Figure 8B:
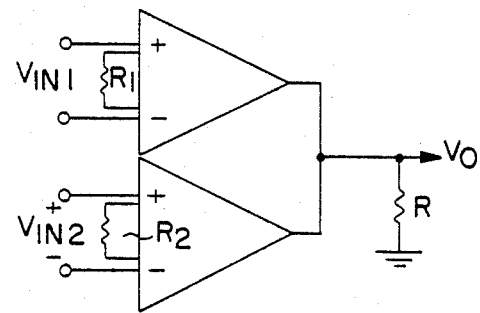
Figure 8C:
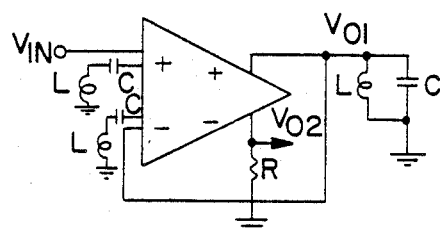
Figure 8D:
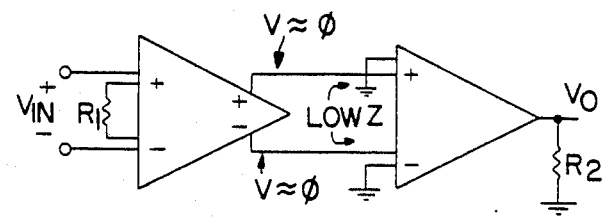

FIGS. 8a through 8c illustrate unusual applications of the precision transconductance amplifier. If the Z1 terminals are shorted as in FIG. 8a, the transconductance is very high and the amplifier begins to take on the behavior of a conventional op-amp (operational amplifier). FIG. 8b shows how output currents can be added. FIG. 8c illustrates a very high gain bandpass amplifier, and FIG. 8d illustrates a cascoded amplifier. Here the first amplifier is operating as a current amplifier which gives it a very wide bandwidth. The circuit of FIG. 8(c) provides a very high gain band pass amplifier with six poles. The controlling equations for the other figures are as follows:

$$R_1 = 0.1\Omega \text{ (lead resistance)} \quad \text{FIG. 8(a)}$$

$$\therefore K \frac{R_2}{R_1} \text{ is large 40,000 v/v if } R_2 = 1 K\Omega \quad \text{FIG. 8(a)}$$

$$V_o = K \frac{R}{R_1} V_{IN1} + K \frac{R}{R_2} V_{IN2} \quad \text{FIG. 8(b)}$$

$$\frac{V_o}{V_{IN}} = K^2 \frac{R_2}{R_1} \quad \text{FIG. 8(d)}$$

Figure 9:
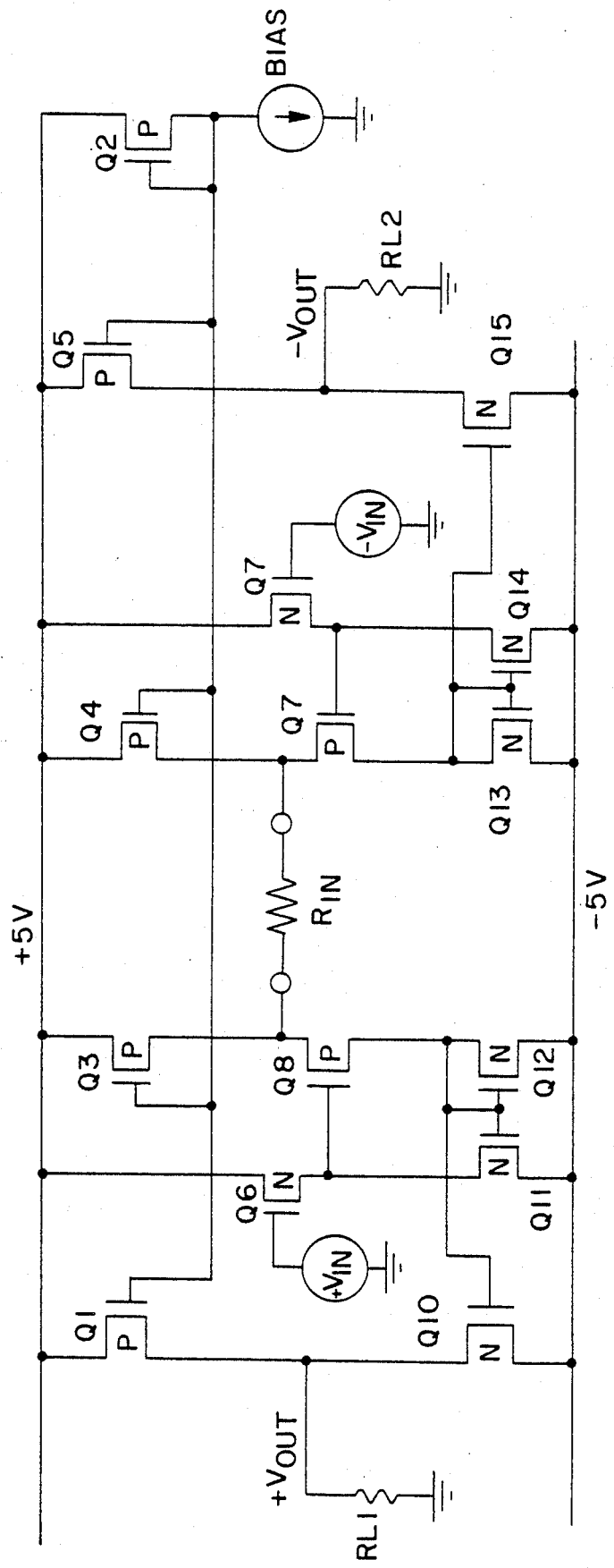
FIG. 9 is a circuit diagram for an embodiment of the present invention similar to that of FIG. 1 but in CMOS form.

FIG. 9 is a circuit diagram for an embodiment of the present invention similar to that of FIG. 1 but in CMOS process technology. In this circuit in comparison to FIG. 1, all PNP transistors of FIG. 1 have been replaced by P-channel FETs and all NPN transistors of FIG. 1 have been replaced by N-channel FETs. Also the resistors other than RIN and RL+ and RL− have been eliminated. The principle of operation, however, is generally the same as that of the embodiment of FIG. 1 and therefore need not be repeated herein.

Figure 10:
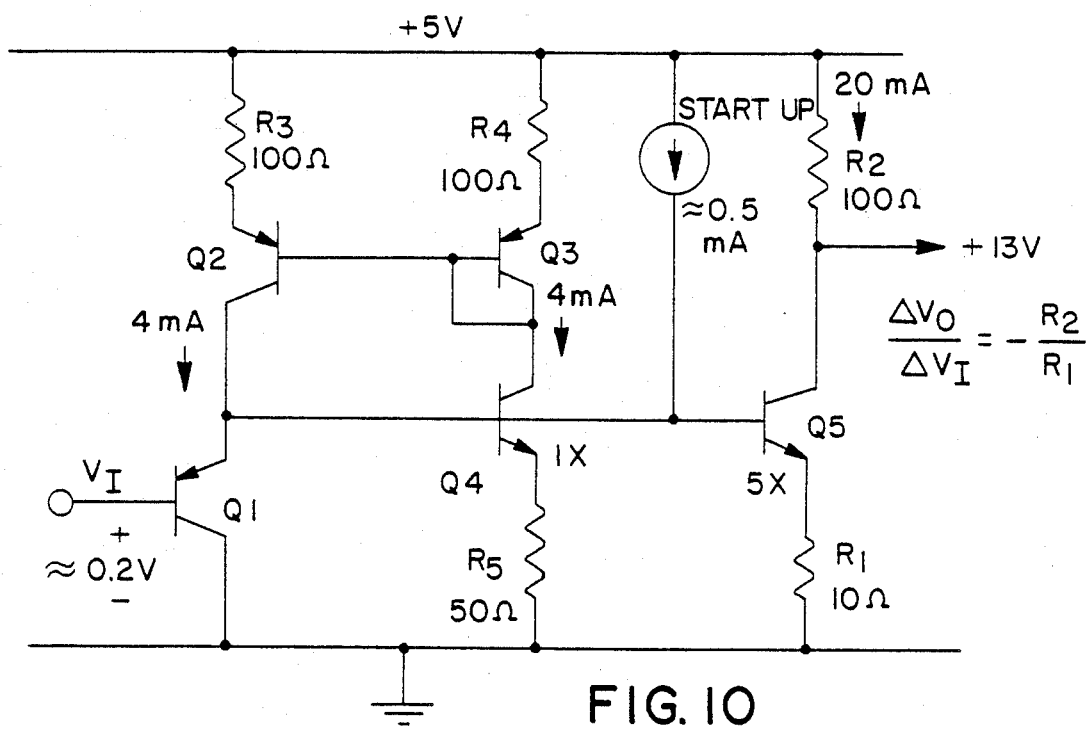
FIG. 10 is a circuit diagram for a single stage linearized amplifier embodiment of the present invention.

Now referring to FIG. 10, a circuit diagram for a single stage linearized bipolar amplifier may be seen. In this embodiment, transistor Q3 and resistor R4 mirror the current in transistor Q4 to transistor Q2 and resistor R3, and thus transistor Q1 in series therewith. Consequently, the currents in Q1 and Q4 are always equal and therefore the base emitter voltages Vbe of Q1 and Q4 are equal. By design, the area of transistor Q5 is preferably some multiple of the area of transistor Q4 and the resistance of resistor R5 is the same multiple of the resistance of resistor R1 (by way of example, the area of transistor Q5 may be five times that of Q4 and the value of resistance of resistor R1 one-fifth of that of resistor R5). The output for the circuit is taken between the lower end of resistor R2 and the collector of transistor Q5. In operation, because the Vbe's of transistor Q1 and Q4 are equal, the emitter of transistor Q4 accurately follows the input voltage on the base of transistor Q1. Thus the voltage across resistor R5 and consequently the current therethrough accurately follows the input voltage on the base of transistor Q1. Also, because of the ratios between transistors Q5 and Q4 and resistors R1 and R5, the current through resistor R5 is accurately mirrored (with a multiple of 5 in the example being described) to resistor R1 and transistor Q5. Thus the current variation in resistor R2, which of course follows the current variation of the resistor R1, is directly proportional to the input voltage variation on the base of transistor Q1. Consequently, as shown in the figure, the voltage gain is −R2/R1. Finally, to assure that the circuit is self starting, a small current source is coupled to the bases of transistor Q4 and Q5 to forceably cause the same to start conducting.

Figure 11:
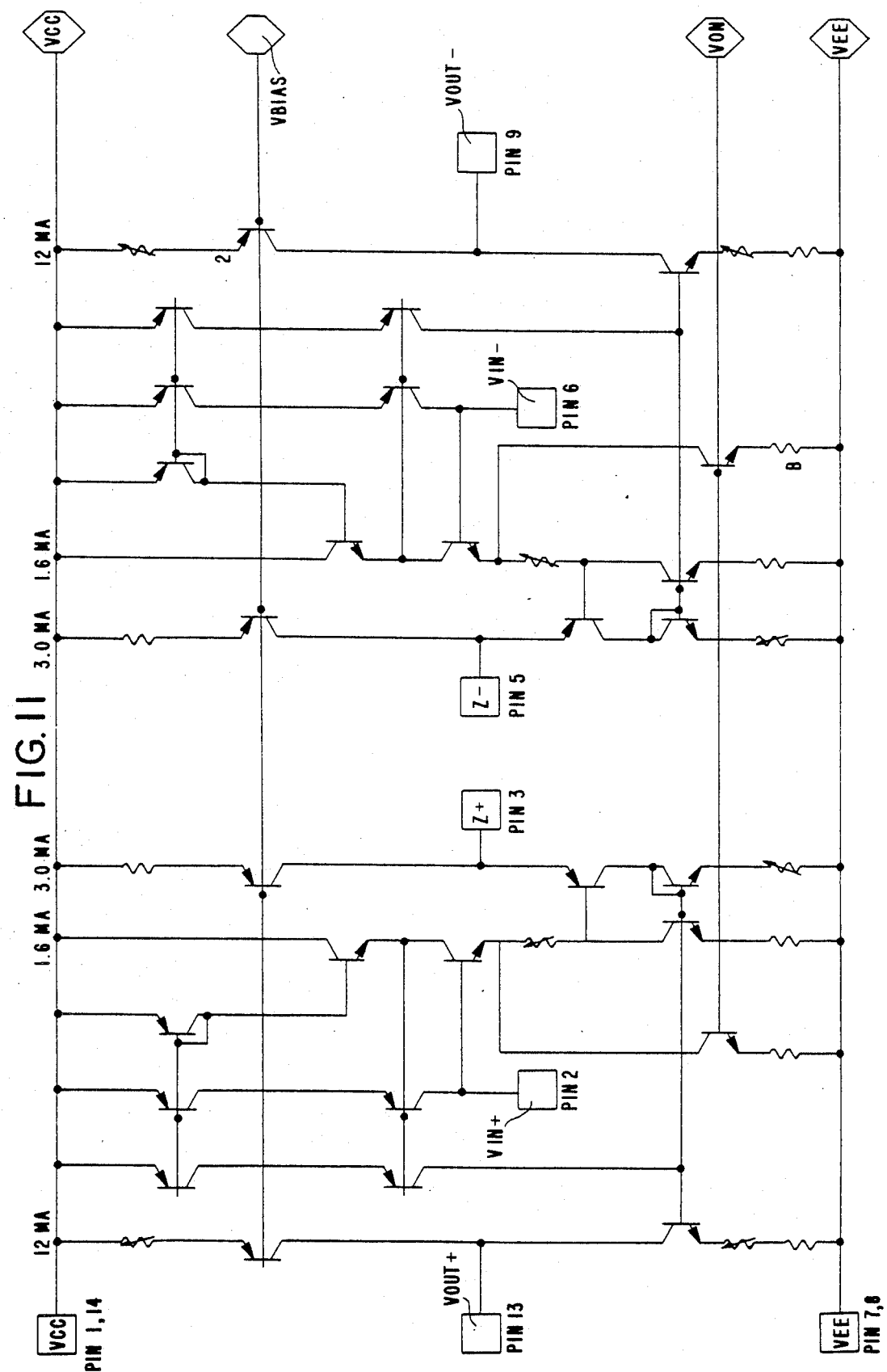
FIG. 11 is a circuit diagram for an actual differential output embodiment of the invention.
Figure 12:
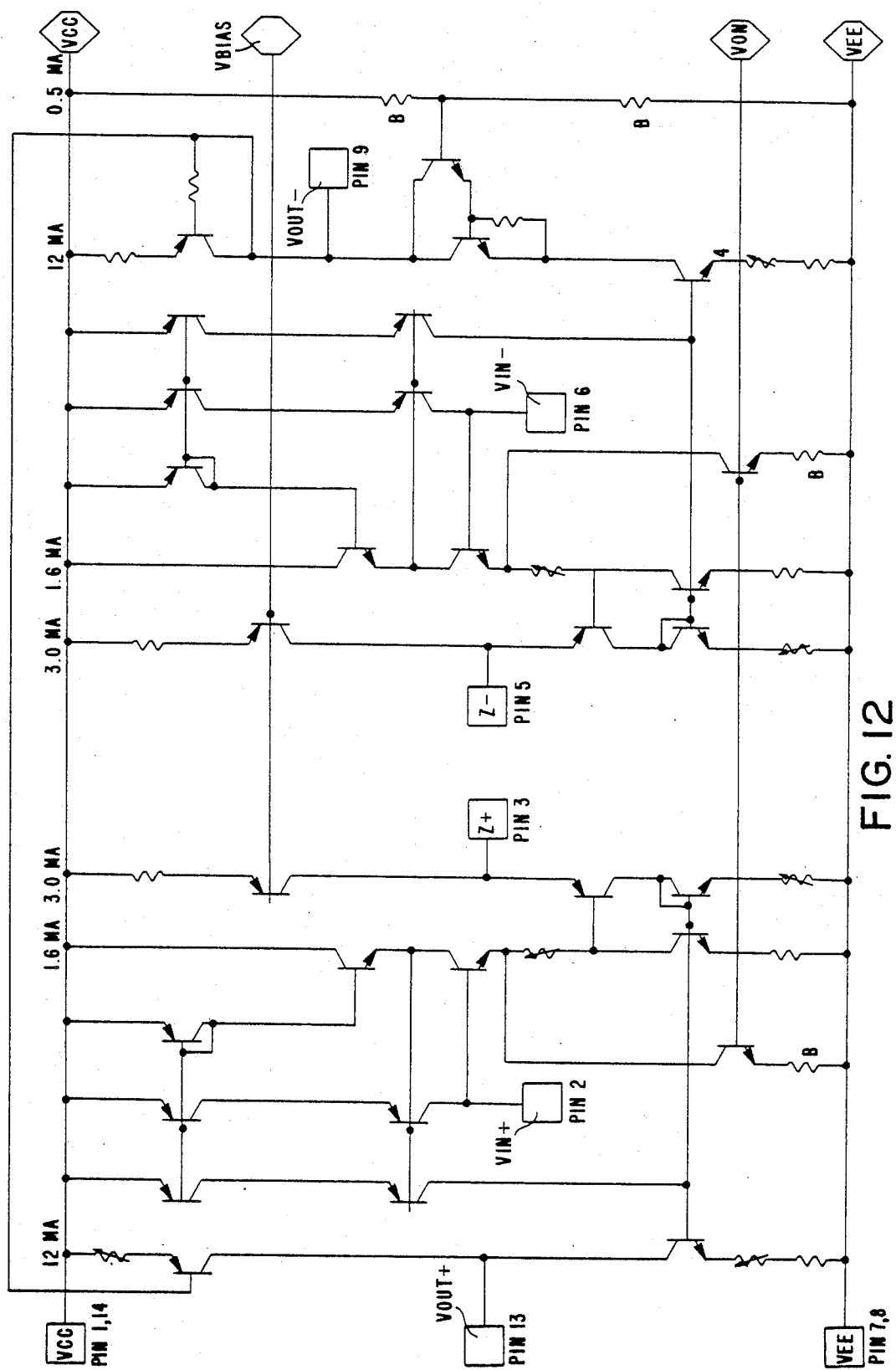
FIG. 12 is a circuit diagram for an actual single-ended output embodiment of the invention.

FIG. 11 is a circuit diagram for an actual differential output embodiment and FIG. 12 is a circuit diagram for an actual single-ended output embodiment of the invention. The voltage Von is generated by bias circuits for the amplifiers (typically on the same chip) and assures that the amplifiers are self starting.

Unlike conventional transconductance amplifiers, the transconductance of the precision transconductance amplifier of the present invention is set by the impedance of a two terminal network, usually a resistor. Since the transconductance is set by the resistor, it is very stable and well defined. The input terminals of the precision transconductance amplifier look like those of an instrumentation amplifier, that is, differential and common mode input signals can be a few volts in magnitude. The precision transconductance amplifier inherently has high common mode rejection ratio, especially at high frequencies. The precision transconductance amplifier's precision is due to positive feedback circuitry which keeps Vbe constant even though emitter current may change substantially. This improves gain linearity about 100 times over a conventional transconductance amplifier. (Some transconductance amplifiers have linearizing diodes which improve linearity significantly, but lower input impedance significantly.)

Although the transconductance of the precision transconductance amplifier of the present invention is usually set by the resistance of a resistor, it should be again noted that this is not a limitation of the design. In the general case, the output current is $K_{VIN}/Z_{IN}$ where $Z_{IN}$ is the more general form of impedance which may be used (see FIG. 2), for instance, in place of the resistor RIN shown in FIGS. 1 and 9. This allows shaping of the frequency response of the amplifier by proper selection of the impedance $Z_{IN}$ without requiring external feedback or a filter network on the output of the amplifier. As stated before, external feedback would grossly reduce the frequency response of the amplifier. A filter network on the output of the amplifier can also be undesirable, as the amplifier will then amplify the unwanted frequency components before they are attenuated by the filter network. This can increase noise and nonlinearities in the output because any amplifier nonlinearity results in intermodulation of frequency components in the signal, including those temporarily amplified before ultimately being filtered out. Also the amplitude of the unwanted frequency components in the output may limit the range of the amplifier. Representative examples of circuits using at least partially reactive impedances for specific shaping the frequency response of the amplifier and the resulting frequency responses are shown in FIGS. 3d, 4a, 4c (see also FIG. 4d) and 6c.

Thus, while preferred embodiments of the invention have been disclosed and described herein, it will be understood by those skilled in the arts that various changes in form and detail may be made therein without departing from the spirit and scope thereof.

I claim:

1. A transconductance amplifier comprising:
   first and second power input terminals for connection to first and second voltage sources;
   first and second transistors of a first conductivity type, each having an emitter, a base and a collector;
   first and second current sources, the first current source being coupled to the emitter of the first transistor and the second current source being coupled to the emitter of the second transistor;
   means for coupling a first impedance between the emitters of the first and second transistors;
   third and fourth transistors of a second conductivity type, each having an emitter, a base and a collector, the third transistor having its emitter coupled to the base of the first transistor, its collector coupled to a first power supply terminal and its base coupled to a first input terminal, and the fourth transistor having its emitter coupled to the base of the second transistor, its collector coupled to a first power supply terminal and its base coupled to a second input terminal;
   first and second current mirrors, the first current mirror being responsive to the current passing through the emitter of the first transistor to mirror a current proportional thereto to the emitter of the third transistor and the second current mirror being responsive to the current passing through the emitter of the second transistor to mirror a current proportional thereto to the emitter of the fourth transistor; and,
   means for providing a first output current responsive to the current of one of said first and second current mirrors.

2. The transconductance amplifier of claim 1 further comprised of a means for providing a second output current responsive to the current of the other of said first and second current mirrors.

3. The transconductance amplifier of claim 1 wherein the first and second transistors are PNP transistors and the third and fourth transistors are NPN transistors, and further comprised of second and third resistances, the second resistance being coupled in series with the emitter of the third transistor and the third resistance being coupled in series with the emitter of the fourth transistor, the second and third resistances being selected so that the voltage of the emitter of the first transistor closely tracks the voltage of the base of the third transistor and the voltage of the emitter of the second transistor closely tracks the voltage of the base of the fourth transistor.

4. The transconductance amplifier of claim 1 further including an at least partially reactive impedance coupled between the emitters of the first and second transistors.

5. A differential transconductance amplifier comprising:
   first and second power input terminals for connection to first and second voltage sources;
   first and second transistors of a first conductivity type, each having an emitter, a base and a collector;
   means for coupling a first impedance between the emitters of the first and second transistors;
   a current source for providing a reference current;
   first and second current mirror means for mirroring a current proportional to the reference current to the junction of the emitter of the first transistor and the first resistance and for mirroring a corresponding current to the junction of the emitter of the second transistor and the first resistance, respectively;
   third and fourth transistors of a second conductivity type, each having an emitter, a base and a collector, the third transistor having its emitter coupled to the base of the first transistor, its collector coupled to a first power supply terminal and its base coupled to an input terminal, and the fourth transistor having its emitter coupled to the base of the second transistor, its collector coupled to a first power supply terminal and its base coupled to an input terminal;
   third and fourth current mirror means, the third current mirror means being responsive to the current passing through the emitter of the first transistor to mirror a current proportional thereto to the emitter of the third transistor and the fourth current mirror means being responsive to the current passing through the emitter of the second transistor to mirror a current proportional thereto to the emitter of the fourth transistor; and, means for providing a first output current responsive to the current of one of said first and second current mirrors.

6. The transconductance amplifier of claim 5 further comprised of a means for providing a second output current responsive to the current of the other of said first and second current mirrors.

7. The transconductance amplifier of claim 5 wherein the first and second transistors are PNP transistors and the third and fourth transistors are NPN transistors, and further comprised of second and third resistances, the second resistance being coupled in series with the emitter of the third transistor and the third resistance being coupled in series with the emitter of the fourth transistor, the second and third resistances being selected so that the voltage of the emitter of the first transistor closely tracks the voltage of the base of the third transistor and the voltage of the emitter of the second transistor closely tracks the voltage of the base of the fourth transistor.

8. The transconductance amplifier of claim 5 further including an at least partially reactive impedance coupled between the emitters of the first and second transistors.

9. A transconductance amplifier comprising:

first and second power input terminals for connection to first and second voltage sources;

first and second field effect devices of a first conductivity type, each having a source, a gate and a drain;

first and second current sources, the first current source being coupled to the source of the first field effect device and the second current source being coupled to the source of the second field effect device;

means for coupling a first impedance between the sources of the first and second field effect devices;

third and fourth field effect devices of a second conductivity type, each having a source, a gate and a drain, the third field effect device having its source coupled to the gate of the first field effect device, its drain coupled to a first power supply terminal and its gate coupled to a first input terminal, and the fourth field effect device having its source coupled to the gate of the second field effect device, its drain coupled to a first power supply terminal and its gate coupled to a second input terminal;

first and second current mirrors, the first current mirror being responsive to the current passing through the source of the first field effect device to mirror a current proportional thereto to the source of the third field effect device and the second current mirror being responsive to the current passing through the source of the second field effect device to mirror a current proportional thereto to the source of the fourth field effect device; and, means for providing a first output current responsive to the current of one of said first and second current mirrors.

10. The transconductance amplifier of claim 9 further comprised of a means for providing a second output current responsive to the current of the other of said first and second current mirrors.

11. The transconductance amplifier of claim 9 wherein the first and second field effect devices are P channel field effect devices and the third and fourth field effect devices are N channel field effect devices.

12. A differential transconductance amplifier comprising:

first and second power input terminals for connection to first and second voltage sources;

first and second field effect devices of a first conductivity type, each having a source, a gate and a drain;

means for coupling a first impedance between the sources of the first and second field effect devices;

a current source for providing a reference current;

first and second current mirror means for mirroring a current proportional to the reference current to the junction of the source of the first field effect device and the first impedance and for mirroring a corresponding current to the junction of the source of the second field effect device and the first impedance, respectively;

third and fourth field effect devices of a second conductivity type, each having a source, a gate and a drain, the third field effect device having its source coupled to the gate of the first field effect device, its drain coupled to a first power supply terminal and its gate coupled to an input terminal, and the fourth field effect device having its source coupled to the gate of the second field effect device, its drain coupled to a first power supply terminal and its gate coupled to another input terminal;

third and fourth current mirror means, the third current mirror means being responsive to the current passing through the source of the first field effect device to mirror a current proportional thereto to the source of the third field effect device and the fourth current mirror means being responsive to the current passing through the source of the second field effect device to mirror a current proportional thereto to the source of the fourth field effect device; and, means for providing a first output current responsive to the current of one of said first and second current mirrors.

13. The transconductance amplifier of claim 12 further comprised of a means for providing a second output current responsive to the current of the other of said first and second current mirrors.

14. The transconductance amplifier of claim 12 wherein the first and second field effect devices are P channel field effect devices and the third and fourth field effect devices are N channel field effect devices.

15. The transconductance amplifier of claim 12 further including an at least partially reactive impedance coupled between the sources of the first and second field effect devices.

16. A transconductance amplifier comprising:

first and second power input terminals for connection to first and second voltage sources;

a first transistor of a first conductivity type having an emitter, a base and a collector, the first transistor having its base coupled to a signal input terminal and its collector coupled to the second power input terminal;

a current mirror coupled to the first power input terminal, the current mirror having first and second current mirror connections and being a means for providing a current through the first current mirror connection proportional to the current through the second current mirror connection, the first current mirror connection being coupled to the emitter of the first transistor;

second and third transistors of a second conductivity type, each having an emitter, a base and a collector, the second and third transistors each having its emitter coupled to the second power input terminal through first and second resistors, respectively, the bases of the second and third transistors being coupled to the emitter of the first transistor, the collector of the third transistor being coupled to a signal output terminal;

the current mirror and the geometry of the first and second transistors being selected so that the current density in the emitter of the first transistor is substantially equal to the current density in the emitter of the second transistor.

17. The transconductance amplifier of claim 16 further comprised of a resistor coupled between the signal output terminal and the first power input terminal.

18. The transconductance amplifier of claim 16 wherein the first transistor is a PNP transistor and the second and third transistors are NPN transistors.

19. The transconductance amplifier of claim 16 wherein the current mirror comprises fourth and fifth transistors of the first conductivity type, each having an emitter, a base and a collector, the fourth transistor having its collector coupled to the emitter of the first transistor, its base coupled of the base of the fifth transistor and to the collectors of the second and fifth transistors, and its emitter coupled to the first power input terminal through a third resistor, the emitter of the fifth transistor being coupled to the first power input terminal through a fourth resistor, the geometry of the first, second, third and fourth transistors and the resistances of the third and fourth resistors being selected so that the current density in the emitter of the fourth transistor is substantially equal to the current density in the emitter of the fifth transistor.

20. The transconductance amplifier of claim 16 wherein the current density in the emitter of the third transistor is substantially equal to the current density in the first and second transistors.

21. The transconductance amplifier of claim 20 further comprised of a resistor coupled between the signal output terminal and the first power input terminal, wherein the current in the third transistor is substantially larger than the current in the first transistor and wherein the resistor coupled between the signal output terminal and the first power input terminal has a substantially larger resistance than the second resistor.

* * * * *

UNITED STATES PATENT AND TRADEMARK OFFICE
CERTIFICATE OF CORRECTION

PATENT NO. : 5,142,242
DATED : August 25, 1992
INVENTOR(S) : Gregory L. Schaffer It is certified that error appears in the above-identified patent and that said Letters Patent is hereby corrected as shown below:

In column 2 at line 42, please delete " hproportional " and insert -- proportional --.

In column 3 at line 65, please delete " V/v " and insert -- V/V --.

In column 4 at line 6, please delete " (vGND) " and insert -- VGND --.

In column 4 at line 28, please delete " $V_oV_{IN}$ " and insert -- $(V_o/V_{IN})$ --.

In column 4 at line 29, please delete " l $V_{IN}/Ai$ l " and insert -- l $V_{IN}/Zi$ l --.

In column 7 at line 27, please delete " $K_{VIN}$ " and insert -- $KV_{IN}$ --.

In column 7 at line 30, please delete " RIN " and insert -- $R_{IN}$ --.

Signed and Sealed this

Twenty-first Day of January, 1997

Attest:

BRUCE LEHMAN

*Attesting Officer*     *Commissioner of Patents and Trademarks*